United States Patent
Sinha et al.

(10) Patent No.: US 8,803,619 B1
(45) Date of Patent: Aug. 12, 2014

(54) RELAXATION OSCILLATOR WITH SELF-BIASED COMPARATOR

(71) Applicants: Anand Kumar Sinha, Noida (IN); Sanjay K. Wadhwa, Noida (IN)

(72) Inventors: Anand Kumar Sinha, Noida (IN); Sanjay K. Wadhwa, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 13/753,544

(22) Filed: Jan. 30, 2013

(51) Int. Cl.
*H03K 3/26* (2006.01)
*H03K 3/36* (2006.01)

(52) U.S. Cl.
CPC ........................................ *H03K 3/36* (2013.01)
USPC .............. 331/111; 331/143; 327/344; 327/63

(58) Field of Classification Search
CPC ..... H03K 5/1565; H03K 7/08; H03K 17/133; H03K 17/28; H03K 17/955; H03K 19/00361; H03K 19/01707; H03K 19/0948; H03K 2217/960735; H03K 2217/960765; H03K 3/017; H03K 3/023; H03K 3/0322; H03K 3/78; H03K 4/066; H03K 4/08; H03K 4/50; H03K 4/501
USPC .............................. 331/111, 143; 327/344, 63
See application file for complete search history.

(56) References Cited

U.S. PATENT DOCUMENTS

| | | |
|---|---|---|
| 5,670,915 A | 9/1997 | Cooper |
| 6,590,464 B1 | 7/2003 | Lin |
| 6,680,656 B2 | 1/2004 | Chen |
| 6,917,249 B1 | 7/2005 | Kuo |
| 7,109,804 B2 | 9/2006 | Mader |
| 7,443,254 B2 | 10/2008 | Gong |
| 7,733,191 B2 | 6/2010 | Olmos |
| 8,350,631 B1 | 1/2013 | Wadhwa |
| 2005/0073370 A1 | 4/2005 | Mitsuda |
| 2010/0066457 A1 | 3/2010 | Muller |
| 2012/0126906 A1 | 5/2012 | Choe |
| 2014/0118078 A1* | 5/2014 | Sinha et al. .................... 331/111 |

* cited by examiner

*Primary Examiner* — Arnold Kinkead
(74) *Attorney, Agent, or Firm* — Charles Bergere

(57) ABSTRACT

A relaxation oscillator for generating an output clock signal includes an RC circuit, a self-biased comparator stage, and a logic circuit. The RC circuit generates first and second comparator input signals that are provided to the self-biased comparator stage. The self-biased comparator stage includes first and second input stages and a voltage reference circuit. Each of the first and second input stages in conjunction with the voltage reference circuit forms a comparator, i.e., first and second comparators corresponding to the first and second input stages, respectively. The self-biased comparator stage generates first and second comparator output signals, based on the first and second comparator input signals. The first and second comparator output signals are provided to the logic circuit that generates the output clock signal.

10 Claims, 2 Drawing Sheets

US 8,803,619 B1

RELAXATION OSCILLATOR WITH SELF-BIASED COMPARATOR

BACKGROUND OF THE INVENTION

The present invention generally relates to relaxation oscillators, and, more particularly, to a relaxation oscillator with a self-biased comparator.

Relaxation oscillators are widely used in modern electronic systems including radios, telecommunications, computers, and other electronic systems to generate oscillator signals. The oscillator signals are required to meet timing critical requirements such as modulation and demodulation of message signals in communication systems, synchronous operation of electronic circuits, and so forth. A conventional relaxation oscillator includes a resistor-capacitor (RC) circuit connected to a power supply, first and second comparators, and a logic circuit. The RC circuit includes a resistor and first and second capacitors. The first and second capacitors are connected to the first and second comparators to provide first and second capacitor voltages to negative terminals of the first and second comparators, respectively. The first and second comparators receive a threshold voltage generated by a resistor-divider circuit connected between a power supply and ground or receive a suitably divided bandgap reference voltage. The first and second capacitors are alternately charged by the power supply by way of the resistor. When a capacitor voltage corresponding to the first capacitor reaches the threshold voltage, the corresponding comparator that receives the capacitor voltage trips and causes a transition in an output signal generated by the comparator. Subsequently, the first capacitor discharges and simultaneously the second capacitor is charged until its capacitor voltage reaches the threshold voltage. Thereafter, the charging and discharging of the first and second capacitors is repeated. The logic circuit is connected to outputs of the first and second comparators and generates an oscillator signal based on transitions in output signals generated by the first and second comparators and control signals for charging and discharging the first and second capacitors.

The first and second comparators require a current source to operate, which occupies silicon area and consumes power. Since cost and battery life of electronic devices have placed strict constraints on system-on-a-chip (SoC) area and power consumption, having separate circuits for the first and second comparators and the current source considerably increases the area and power consumed by the SoC. Additionally, propagation delays of the first and second comparators vary substantially across process corners, which leads to a variation in the frequency of the oscillator signal and deterioration in the fidelity of the oscillator signal.

Therefore, it would be advantageous to have a relaxation oscillator that has low frequency spread across low supply voltage and process and temperature corners, that consumes less power, has a small area footprint, and that overcomes the above-mentioned limitations of existing relaxation oscillators.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
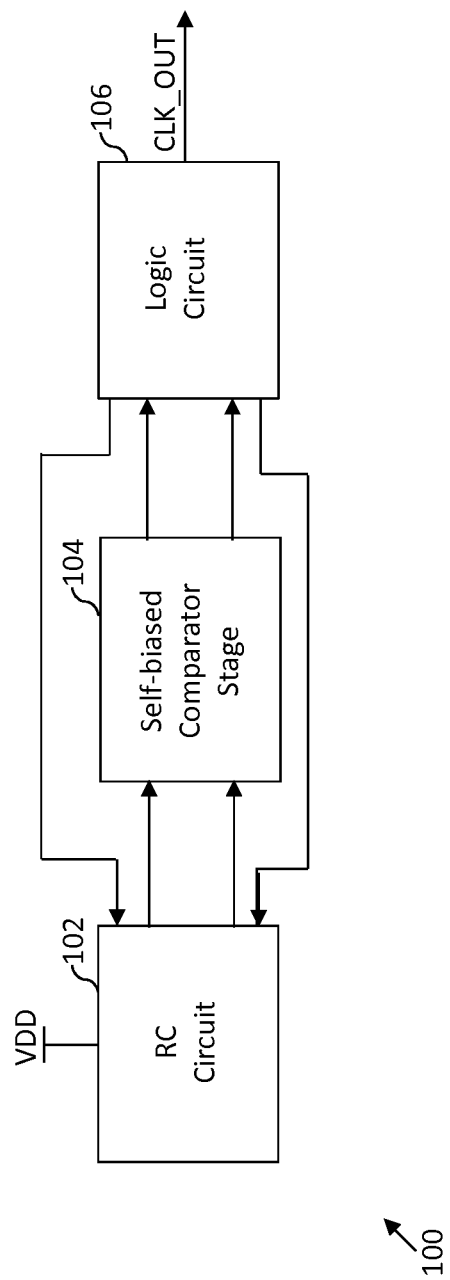
FIG. 1 is a schematic block diagram of a relaxation oscillator in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a relaxation oscillator for generating an output clock signal is provided. The relaxation oscillator includes a resistor-capacitor (RC) circuit for generating first and second comparator input signals and receiving first and second control signals. A self-biased comparator stage is connected to the RC circuit for generating first and second comparator output signals. The self-biased comparator stage includes a self-biased comparator that receives the first and second comparator input signals and generates first and second intermediate output signals. The self-biased comparator includes a first input stage for receiving the first comparator input signal and generating the first intermediate output signal. The first input stage includes: a first transistor having a source terminal for receiving a supply voltage and a second transistor having a drain terminal connected to a drain terminal of the first transistor, and a gate terminal for receiving the first comparator input signal. The first intermediate output signal is generated at the drain terminals of the first and second transistors. The self-biased comparator further includes a second input stage for receiving the second comparator input signal and generating the second intermediate output signal. The second input stage includes: a third transistor having a source terminal for receiving the supply voltage and a fourth transistor having a drain terminal connected to a drain terminal of the third transistor, a gate terminal for receiving the second comparator input signal, and a source terminal connected to a source terminal of the second transistor. The second intermediate output signal is generated at the drain terminals of the third and fourth transistors.

The self-biased comparator further includes a voltage reference circuit for generating a voltage bias signal. The voltage reference circuit includes fifth and sixth transistors of which the fifth transistor has a source terminal for receiving the supply voltage, a gate terminal connected to a gate terminal of the third transistor, and a drain terminal connected to a gate terminal of the first transistor and the gate terminal of the third transistor. The voltage bias signal is generated at the drain terminal of the fifth transistor. The sixth transistor has a drain terminal connected to the drain terminal of the fifth transistor, a gate terminal for receiving a reference voltage, and a source terminal connected to the source terminals of the second and fourth transistors. The self-biased comparator stage further includes a seventh transistor having a drain terminal connected to the source terminals of the second, fourth, and sixth transistors; a first resistor having a first terminal connected to a source terminal of the seventh transistor and a second terminal connected to ground; an eighth transistor having a source terminal for receiving the supply voltage, and a gate terminal connected to the gate and drain terminals of the first and fifth transistors, respectively; a ninth transistor having a drain terminal connected to a drain terminal of the eighth transistor, a gate terminal connected to the drain terminal thereof and to a gate terminal of the seventh transistor, and a source terminal connected to ground; a tenth transistor having a source terminal for receiving the supply voltage, and a gate terminal connected to the drain terminals of the first and second transistors for receiving the first intermediate output signal; and an eleventh transistor having a drain terminal connected to a drain terminal of the tenth transistor, a gate terminal connected to the drain terminals of the eighth and ninth transistors, and a source terminal connected to ground. The first comparator output signal is generated at the drain terminals of the tenth and eleventh transistors.

The self-biased comparator stage further includes a twelfth transistor having a source terminal for receiving the supply voltage, and a gate terminal connected to the drain terminals of the third and fourth transistors for receiving the second intermediate output signal and a thirteenth transistor having a drain terminal connected to a drain terminal of the twelfth transistor, a gate terminal connected to the gate terminals of the seventh and ninth transistors, and a source terminal connected to ground. The second comparator output signal is generated at the drain terminals of the twelfth and thirteenth transistors.

In another embodiment of the present invention, a self-biased comparator stage is provided. The self-biased comparator stage includes a self-biased comparator for receiving first and second comparator input signals and generating first and second intermediate output signals. The self-biased comparator includes a first input stage for receiving the first comparator input signal and generating the first intermediate output signal. The first input stage includes: a first transistor having a source terminal for receiving a supply voltage and a second transistor having a drain terminal connected to a drain terminal of the first transistor, and a gate terminal for receiving the first comparator input signal. The first intermediate output signal is generated at the drain terminals of the first and second transistors.

The self-biased comparator further includes a second input stage for receiving the second comparator input signal and generating the second intermediate output signal. The second input stage includes: a third transistor having a source terminal for receiving the supply voltage and a fourth transistor having a drain terminal connected to a drain terminal of the third transistor, a gate terminal for receiving the second comparator input signal, and a source terminal connected to a source terminal of the second transistor. The second intermediate output signal is generated at the drain terminals of the third and fourth transistors. The self-biased comparator further includes a voltage reference circuit for generating a voltage bias signal. The voltage reference circuit includes fifth and sixth transistors of which the fifth transistor has a source terminal for receiving the supply voltage, a gate terminal connected to a gate terminal of the third transistor, and a drain terminal connected to a gate terminal of the first transistor and the gate terminal of the third transistor. The voltage bias signal is generated at the drain terminal of the fifth transistor. The sixth transistor has a drain terminal connected to the drain terminal of the fifth transistor, a gate terminal for receiving a reference voltage, and a source terminal connected to the source terminals of the second and fourth transistors. The self-biased comparator stage further includes a seventh transistor having a drain terminal connected to the source terminals of the second, fourth, and sixth transistors; a first resistor having a first terminal connected to a source terminal of the seventh transistor and a second terminal connected to ground; an eighth transistor having a source terminal for receiving the supply voltage, and a gate terminal connected to the gate and drain terminals of the first and fifth transistors, respectively; a ninth transistor having a drain terminal connected to a drain terminal of the eighth transistor, a gate terminal connected to the drain terminal thereof and to a gate terminal of the seventh transistor, and a source terminal connected to ground; a tenth transistor having a source terminal for receiving the supply voltage, and a gate terminal connected to the drain terminals of the first and second transistors for receiving the first intermediate output signal; and an eleventh transistor having a drain terminal connected to a drain terminal of the tenth transistor, a gate terminal connected to the drain terminals of the eighth and ninth transistors, and a source terminal connected to ground. The first comparator output signal is generated at the drain terminals of the tenth and eleventh transistors.

The self-biased comparator stage further includes a twelfth transistor having a source terminal for receiving the supply voltage, and a gate terminal connected to the drain terminals of the third and fourth transistors for receiving the second intermediate output signal and a thirteenth transistor having a drain terminal connected to a drain terminal of the twelfth transistor, a gate terminal connected to the gate terminals of the seventh and ninth transistors, and a source terminal connected to ground. The second comparator output signal is generated at the drain terminals of the twelfth and thirteenth transistors.

Various embodiments of the present invention provide a relaxation oscillator that includes a resistor-capacitor (RC) circuit, a self-biased comparator stage, and a logic circuit. The RC circuit generates first and second comparator input signals that are provided to the self-biased comparator stage. The self-biased comparator stage includes first and second input stages and a voltage reference circuit. Each of the first and second input stages form a comparator (i.e., the first and second comparators corresponding to the first and second input stages, respectively), in conjunction with the voltage reference circuit (a delta-$V_{GS}$/R current reference circuit). Since, the first and second comparators and the voltage reference circuit are formed as a single module (i.e., the self-biased comparator stage) and the voltage reference circuit is shared by the first and second comparators, considerable reduction in power consumption and area footprint of the relaxation oscillator is realized. Additionally, the integration enables operation of the relaxation oscillator using a low voltage power supply.

The first and second comparators receive first and second comparator input signals and a voltage bias signal (a reference current) generated by the voltage reference circuit. The first and second comparators generate first and second intermediate output signals, that are transmitted to first and second gain stages, respectively. The first and second gain stages provide gain to the first and second intermediate output signals to generate first and second comparator output signals that are transmitted to the logic circuit. The logic circuit generates an output clock signal based on the first and second comparator output signals. The design of the self-biased comparator stage ensures smooth and consistent transitions in the first and second intermediate output signals at a predetermined threshold voltage and across various process and temperature corners, thereby ensuring a low frequency spread across various process and temperature corners.

Referring now to FIG. 1, a schematic block diagram of a relaxation oscillator 100, in accordance with an embodiment of the present invention is shown. The relaxation oscillator 100 includes a resistor-capacitor (RC) circuit 102, a self-biased comparator stage 104, and a logic circuit 106.

The RC circuit 102 is formed using first and second capacitors (not shown) that are connected to a power supply $V_{DD}$ by way of a first resistor (not shown), respectively, in a manner known to those of skill in the art. The first and second capacitors are alternately charged by the power supply $V_{DD}$ by way of the first resistor. The RC circuit 102 generates first and second comparator input signals that are provided to the self-biased comparator stage 104. The self-biased comparator stage 104 generates first and second comparator output signals that are provided to the logic circuit 106. In an embodiment of the present invention, the self-biased comparator stage 104 includes a self-biased comparator for receiving the first and second comparator input signals and generating first and second intermediate output signals.

The logic circuit 106 receives the first and second comparator output signals and generates first and second control signals and an output clock signal. The logic circuit 106 transmits the first and second control signals to the RC circuit 102. The first and second control signals control charging and discharging of the first and second capacitors (not shown). The logic circuit 106 includes combinational logic formed using logic gates in a manner known to those of skill in the art.

Figure 2:
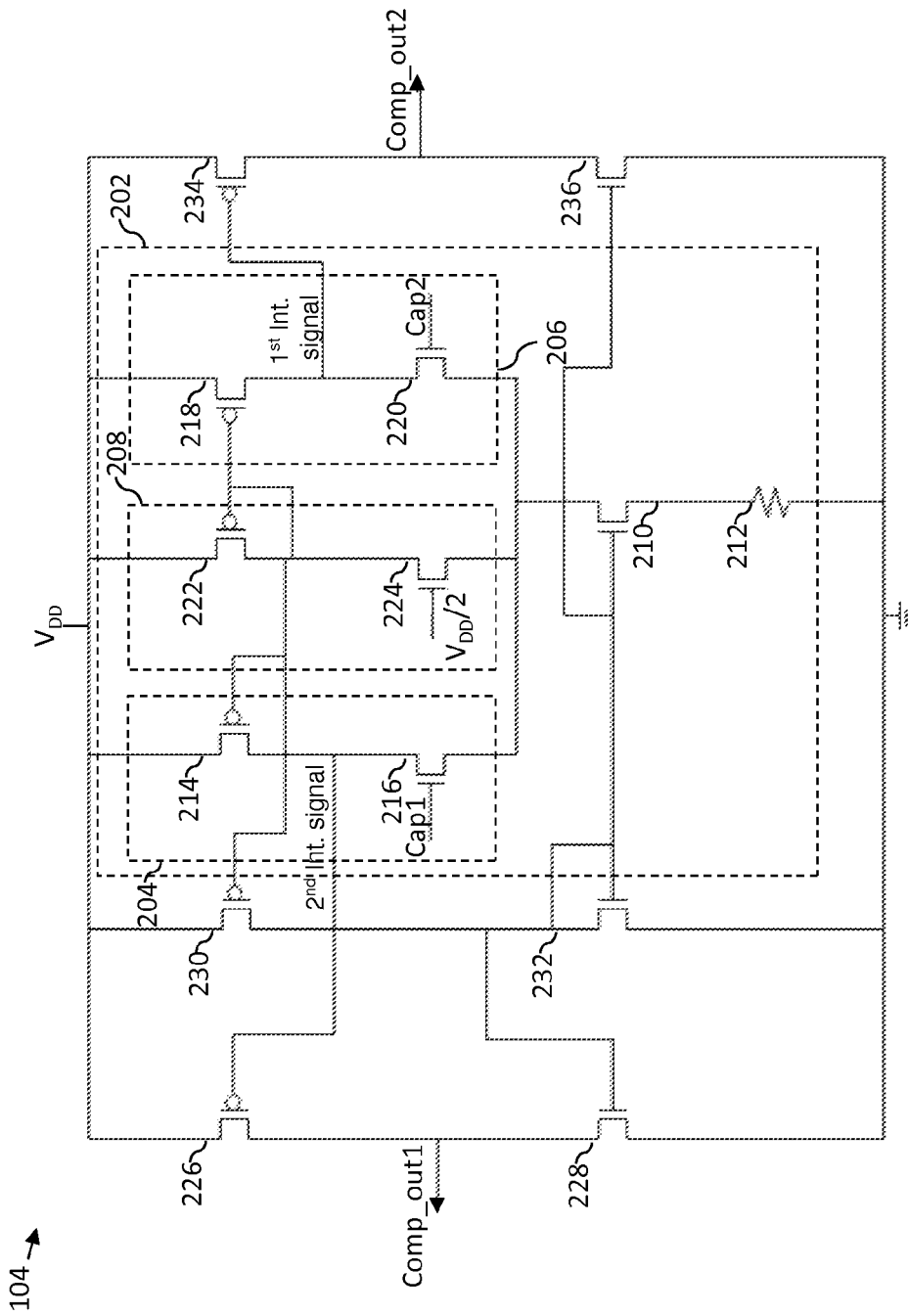
FIG. 2 is a detailed schematic circuit diagram of a self-biased comparator stage in accordance with an embodiment of the present invention.

Referring now to FIG. 2, a detailed schematic circuit diagram of the self-biased comparator stage 104, in accordance with an embodiment of the present invention, is shown. The self-biased comparator stage 104 includes a self-biased comparator 202. The self-biased comparator 202 includes first and second input stages 204 and 206, a voltage reference circuit 208, a first transistor 210, and a second resistor 212. The first input stage 204 includes second and third transistors 214 and 216, the second input stage 206 includes fourth and fifth transistors 218 and 220, and the voltage reference circuit 208 includes sixth and seventh transistors 222 and 224. The self-biased comparator stage 104 further includes six transistors (eighth through thirteenth) 226-236.

A source terminal of the second transistor 214 receives a supply voltage ($V_{DD}$). A drain terminal of the third transistor 216 is connected to a drain terminal of the second transistor 214, and a gate terminal of the third transistor 216 receives a first comparator input signal (Cap1). In an embodiment of the present invention, the first comparator input signal Cap1 is generated by the RC circuit 102. A source terminal of the fourth transistor 218 receives the supply voltage $V_{DD}$. A drain terminal of the fifth transistor 220 is connected to a drain terminal of the fourth transistor 218, and a gate terminal of the fifth transistor 220 receives a second comparator input signal (Cap2). The second comparator input signal Cap2 is also generated by the RC circuit 102.

A source terminal of the sixth transistor 222 receives the supply voltage $V_{DD}$ and a gate terminal thereof is connected to a gate terminal of the fourth transistor 218. A drain terminal of the seventh transistor 224 is connected to a gate terminal of the second transistor 214, the gate terminals of the fourth and sixth transistors 218 and 222, and a drain terminal of the sixth transistor 222. A gate terminal of the seventh transistor 224 receives a reference voltage ($V_{DD}/2$). In an embodiment of the present invention, the reference voltage $V_{DD}/2$ is generated by a reference voltage generating circuit (not shown). A drain terminal of the first transistor 210 is connected to source terminals of the third, fifth, and seventh transistors 216, 220, and 224. A first terminal of the second resistor 212 is connected to a source terminal of the first transistor 210 and a second terminal of the second resistor 212 is connected to ground.

A source terminal of the eighth transistor 226 receives the supply voltage $V_{DD}$ and a gate terminal thereof is connected to the drain terminals of the second and third transistors 214 and 216. A drain terminal of the ninth transistor 228 is connected to a drain terminal of the eighth transistor 226, and a source terminal of the ninth transistor 228 is connected to ground. A source terminal of the tenth transistor 230 receives the supply voltage $V_{DD}$ and a gate terminal thereof is connected to the drain terminal of the sixth transistor 222. A drain terminal of the eleventh transistor 232 is connected to a drain terminal of the tenth transistor 230 and to gate terminals of the ninth and eleventh transistors 228 and 232, and a source terminal of the eleventh transistor 232 is connected to ground. The gate terminal of the eleventh transistor 232 is further connected to a gate terminal of the first transistor 210.

A source terminal of the twelfth transistor 234 receives the supply voltage $V_{DD}$ and a gate terminal thereof is connected to the drain terminals of the fourth and fifth transistors 218 and 220. A drain terminal of the thirteenth transistor 236 is connected to a drain terminal of the twelfth transistor 234, a gate terminal of the thirteenth transistor 236 is connected to the gate terminals of the first and eleventh transistors 210 and 232, and a source terminal of the thirteenth transistor 236 is connected to ground.

The first, sixth, seventh, tenth, and eleventh transistors 210, 222, 224, 230, and 232 form a current reference circuit that generates a reference current (or a voltage bias signal) at the drain terminal of the sixth transistor 222. The sixth and tenth transistors 222 and 230 form a p-channel metal-oxide semiconductor (PMOS) current mirror and the first and eleventh transistors 210 and 232 form a n-channel metal-oxide semiconductor (NMOS) current mirror. The width-to-length (W/L) ratios of the first and eleventh transistors 210 and 232 is M:1 (in which M>1). Since, the first and eleventh transistors 210 and 232 carry identical current imposed by the PMOS current mirror, the first transistor 210 (having a higher W/L ratio) has a smaller value of $V_{GS}$. Therefore, a potential difference is created across the second resistor 212 due to the difference in the $V_{GS}$ values of the first and eleventh transistors 210 and 232. The potential difference is applied across the first and second terminals of the second resistor 212 and the reference current is generated at the drain terminal of the sixth transistor 222 and at the drain terminal of the tenth transistor 230. The current reference circuit may be a (delta-$V_{GS}/R$) current reference circuit which is well known to those skilled in art.

The reference current is transmitted to the drain terminals of the second and fourth transistors 214 and 218. The third and fifth transistors 216 and 220 receive first and second comparator input signals Cap1 and Cap2. The second and third transistors 214 and 216 and the sixth and seventh transistors 222 and 224 form a first comparator that generates a first intermediate output signal at the drain terminal of the second transistor 214, based on the first comparator input signal Cap1. The fourth and fifth transistors 218 and 220 and the sixth and seventh transistors 222 and 224 form a second comparator that generates a second intermediate output signal at the drain terminal of the fourth transistor 218, based on the second comparator input signal Cap2. The first intermediate output signal is transmitted to the gate terminal of the eighth transistor 226. The eighth and ninth transistors 226 and 228 provide gain to the first intermediate output signal to generate a first comparator output signal (Comp_out1) at the drain terminal of the eighth transistor 226. The second intermediate output signal is transmitted to the gate terminal of the twelfth transistor 234. The twelfth and thirteenth transistors 234 and 236 provide gain to the second intermediate output signal to generate a second comparator output signal (Comp_out2) at the drain terminal of the twelfth transistor 234.

As the current reference circuit formed by the first, sixth, seventh, tenth, and eleventh transistors 210, 222, 224, 230, and 232 is shared between the first and second comparators, the power consumption and area footprint of the relaxation oscillator 100 is considerably reduced. In an embodiment of the present invention, the first, third, fifth, seventh, ninth, eleventh, and thirteenth transistors 210, 216, 220, 224, 228, 232, and 236 are NMOS transistors and the second, fourth, sixth, eight, tenth, twelfth transistors 214, 218, 222, 226, 230, and 234 are PMOS transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A relaxation oscillator for generating an output clock signal, comprising:
a resistor-capacitor (RC) circuit for generating first and second comparator input signals and receiving first and second control signals;
a self-biased comparator stage connected to the RC circuit for generating first and second comparator output signals, the self-biased comparator stage comprising:
a self-biased comparator for receiving the first and second comparator input signals and generating first and second intermediate output signals and the first and second comparator output signals, wherein the self-biased comparator comprises:
a first input stage for receiving the first comparator input signal and generating the first intermediate output signal, wherein the first input stage includes:
a first transistor having a source terminal for receiving a supply voltage; and
a second transistor having a drain terminal connected to a drain terminal of the first transistor, and a gate terminal for receiving the first comparator input signal, wherein the first intermediate output signal is generated at the drain terminals of the first and second transistors;
a second input stage for receiving the second comparator input signal and generating the second intermediate output signal, wherein the second input state includes:
a third transistor having a source terminal for receiving the supply voltage; and
a fourth transistor having a drain terminal connected to a drain terminal of the third transistor, a gate terminal for receiving the second comparator input signal, and a source terminal connected to a source terminal of the second transistor, wherein the second intermediate output signal is generated at the drain terminals of the third and fourth transistors;
a voltage reference circuit for generating a voltage bias signal, wherein the voltage reference circuit comprises:
a fifth transistor having a source terminal for receiving the supply voltage, a gate terminal connected to a gate terminal of the third transistor, and a drain terminal connected to a gate terminal of the first transistor and the gate terminal of the third transistor, wherein the voltage bias signal is generated at the drain terminal of the fifth transistor; and
a sixth transistor having a drain terminal connected to the drain terminal of the fifth transistor, a gate terminal for receiving a reference voltage, and a source terminal connected to the source terminals of the second and fourth transistors;
a seventh transistor having a drain terminal connected to the source terminals of the second, fourth, and sixth transistors; and
a first resistor having a first terminal connected to a source terminal of the seventh transistor and a second terminal connected to ground;
an eighth transistor having a source terminal for receiving the supply voltage, and a gate terminal connected to the gate and drain terminals of the first and fifth transistors, respectively;
a ninth transistor having a drain terminal connected to a drain terminal of the eighth transistor, a gate terminal connected to the drain terminal thereof and to a gate terminal of the seventh transistor, and a source terminal connected to ground;
a tenth transistor having a source terminal for receiving the supply voltage, and a gate terminal connected to the drain terminals of the first and second transistors for receiving the first intermediate output signal;
an eleventh transistor having a drain terminal connected to a drain terminal of the tenth transistor, a gate terminal connected to the drain terminals of the eighth and ninth transistors, and a source terminal connected to ground, wherein the first comparator output signal is generated at the drain terminals of the tenth and eleventh transistors;
a twelfth transistor having a source terminal for receiving the supply voltage, and a gate terminal connected to the drain terminals of the third and fourth transistors for receiving the second intermediate output signal; and
a thirteenth transistor having a drain terminal connected to a drain terminal of the twelfth transistor, a gate terminal connected to the gate terminals of the seventh and ninth transistors, and a source terminal connected to ground, wherein the second comparator output signal is generated at the drain terminals of the twelfth and thirteenth transistors.

2. The relaxation oscillator of claim 1, wherein the first, third, fifth, eighth, tenth, twelfth transistors are p-channel metal-oxide semiconductor (PMOS) transistors.

3. The relaxation oscillator of claim 1, wherein the second, fourth, sixth, seventh, ninth, eleventh, thirteenth transistors are n-channel metal-oxide semiconductor (NMOS) transistors.

4. The relaxation oscillator of claim 1, further comprising a logic circuit connected to the self-biased comparator stage for receiving the first and second comparator output signals and generating the first and second control signals and the output clock signal, wherein the logic circuit transmits the first and second control signals to the RC circuit.

5. A self-biased comparator stage for generating first and second comparator output signals, the self-biased comparator stage comprising:
a self-biased comparator for receiving first and second comparator input signals and generating first and second intermediate output signals and the first and second comparator output signals, wherein the self-biased comparator comprises:
a first input stage for receiving the first comparator input signal and generating the first intermediate output signal, wherein the first input stage includes:
a first transistor having a source terminal for receiving a supply voltage; and a second transistor having a drain terminal connected to a drain terminal of the first transistor, and a gate terminal for receiving the first comparator input signal, wherein the first intermediate output signal is generated at the drain terminals of the first and second transistors;

a second input stage for receiving the second comparator input signal and generating the second intermediate output signal, wherein the second input state includes:
  a third transistor having a source terminal for receiving the supply voltage; and
  a fourth transistor having a drain terminal connected to a drain terminal of the third transistor, a gate terminal for receiving the second comparator input signal, and a source terminal connected to a source terminal of the second transistor, wherein the second intermediate output signal is generated at the drain terminals of the third and fourth transistors;

a voltage reference circuit for generating a voltage bias signal, wherein the voltage reference circuit comprises:
  a fifth transistor having a source terminal for receiving the supply voltage, a gate terminal connected to a gate terminal of the third transistor, and a drain terminal connected to a gate terminal of the first transistor and the gate terminal of the third transistor, wherein the voltage bias signal is generated at the drain terminal of the fifth transistor; and
  a sixth transistor having a drain terminal connected to the drain terminal of the fifth transistor, a gate terminal for receiving a reference voltage, and a source terminal connected to the source terminals of the second and fourth transistors;
  a seventh transistor having a drain terminal connected to the source terminals of the second, fourth, and sixth transistors; and
  a first resistor having a first terminal connected to a source terminal of the seventh transistor and a second terminal connected to ground;

an eighth transistor having a source terminal for receiving the supply voltage, and a gate terminal connected to the gate and drain terminals of the first and fifth transistors, respectively;

a ninth transistor having a drain terminal connected to a drain terminal of the eighth transistor, a gate terminal connected to the drain terminal thereof and to a gate terminal of the seventh transistor, and a source terminal connected to ground;

a tenth transistor having a source terminal for receiving the supply voltage, and a gate terminal connected to the drain terminals of the first and second transistors for receiving the first intermediate output signal;

an eleventh transistor having a drain terminal connected to a drain terminal of the tenth transistor, a gate terminal connected to the drain terminals of the eighth and ninth transistors, and a source terminal connected to ground, wherein the first comparator output signal is generated at the drain terminals of the tenth and eleventh transistors;

a twelfth transistor having a source terminal for receiving the supply voltage, and a gate terminal connected to the drain terminals of the third and fourth transistors for receiving the second intermediate output signal; and a thirteenth transistor having a drain terminal connected to a drain terminal of the twelfth transistor, a gate terminal connected to the gate terminals of the seventh and ninth transistors, and a source terminal connected to ground, wherein the second comparator output signal is generated at the drain terminals of the twelfth and thirteenth transistors.

6. The self-biased comparator stage of claim 5, wherein the self-biased comparator stage is connected to a resistor-capacitor (RC) circuit.

7. The self-biased comparator stage of claim 6, wherein the RC circuit is associated with a relaxation oscillator.

8. The self-biased comparator stage of claim 7, wherein the first and second comparator input signals are generated by the RC circuit.

9. The self-biased comparator stage of claim 8, wherein the first and second comparator output signals are provided to a logic circuit associated with the relaxation oscillator.

10. The self-biased comparator stage of claim 9, wherein the logic circuit generates an output clock signal based on the first and second comparator output signals.

\* \* \* \* \*